United States Patent
Sethi

(10) Patent No.: US 10,931,121 B2
(45) Date of Patent: Feb. 23, 2021

(54) CONTROLLING BATTERY UTILIZATION USING DISCHARGE PATTERN WHEN SYSTEM IS POWERED OFF

(71) Applicant: DELL PRODUCTS, LP, Round Rock, TX (US)

(72) Inventor: Parminder Singh Sethi, Ludhiana (IN)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 16/660,125

(22) Filed: Oct. 22, 2019

(65) Prior Publication Data

US 2020/0050249 A1 Feb. 13, 2020

Related U.S. Application Data

(63) Continuation-in-part of application No. 16/399,634, filed on Apr. 30, 2019, and a continuation-in-part of application No. 15/974,761, filed on May 9, 2018, now Pat. No. 10,658,861.

(51) Int. Cl.
| | |
|---|---|
| *G06F 1/26* | (2006.01) |
| *H02J 7/00* | (2006.01) |
| *H02J 3/14* | (2006.01) |
| *H02J 7/02* | (2016.01) |
| *G01R 31/382* | (2019.01) |

(52) U.S. Cl.
CPC ........ *H02J 7/00034* (2020.01); *G01R 31/382* (2019.01); *H02J 3/14* (2013.01); *H02J 7/00032* (2020.01); *H02J 7/00036* (2020.01); *H02J 7/0071* (2020.01); *H02J 7/0078* (2013.01); *H02J 7/022* (2013.01); *G06F 1/263* (2013.01)

(58) Field of Classification Search
CPC ................................................. H02J 7/007188
See application file for complete search history.

(56) References Cited

U.S. PATENT DOCUMENTS

| | | |
|---|---|---|
| 5,254,928 A | 10/1993 | Young et al. |
| 6,424,123 B1 | 7/2002 | Odaohhara et al. |
| 7,570,015 B2 | 8/2009 | Bansal et al. |

(Continued)

OTHER PUBLICATIONS

Parminder Singh Sethi et al., "System And Method For Managing A Rechargeable Battery Based On Historical Charging Data," Filed On May 9, 2018; 26 Pages, U.S. Appl. No. 15/974,761.

(Continued)

*Primary Examiner* — David V Henze-Gongola
(74) *Attorney, Agent, or Firm* — Larson Newman, LLP

(57) ABSTRACT

An information handling system (IHS) may include a battery management unit (BMU) that remains operational when the IHS in general is in a powered off state. A processor is operational when the IHS in general is in a powered on state but not when the IHS in general is in a powered off state. The BMU is configured to obtain charge and discharge pattern information while the IHS in general is in the powered off state, to transmit the charge and discharge pattern information to the processor when the IHS in general is in the powered on state, to receive user control information from the processor, and to control charge and discharge of a battery according to the user control information when the IHS in general is in the powered off state.

14 Claims, 3 Drawing Sheets

(56) References Cited

U.S. PATENT DOCUMENTS

| | | | |
|---|---|---|---|
| 8,380,999 B1 * | 2/2013 | Robison | H04W 52/0261 713/300 |
| 2007/0123303 A1 * | 5/2007 | Book | H04W 52/0277 455/557 |
| 2011/0018679 A1 | 1/2011 | Davis et al. | |
| 2019/0305597 A1 * | 10/2019 | Venkatraman | H02J 50/80 |

OTHER PUBLICATIONS

Parminder Singh Sethi et al., "Charge/Discharge-Pattern Battery Training System," Filed On Apr. 30, 2019; 30 Pages, U.S. Appl. No. 16/399,634.

* cited by examiner

CONTROLLING BATTERY UTILIZATION USING DISCHARGE PATTERN WHEN SYSTEM IS POWERED OFF

CROSS-REFERENCE TO RELATED APPLICATION(S)

The present application is a continuation-in-part (CIP) of co-pending U.S. patent application Ser. No. 16/399,634, entitled "CHARGE/DISCHARGE-PATTERN BATTERY TRAINING SYSTEM," filed Apr. 30, 2019, the entirety of which is incorporated herein by reference, which is a CIP of U.S. patent application Ser. No. 15/974,761, entitled "SYSTEM AND METHOD FOR MANAGING A RECHARGEABLE BATTERY BASED ON HISTORICAL CHARGING DATA," filed May 9, 2018, the entirety of which is incorporated herein by reference.

FIELD OF THE DISCLOSURE

The present disclosure generally relates to information handling systems, and more particularly to controlling battery utilization in an information handling system.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An information handling system (IHS) may include a battery management unit (BMU) that remains operational when the IHS in general is in a powered off state. A processor is operational when the IHS in general is in a powered on state but not when the IHS in general is in a powered off state. The BMU is configured to obtain charge and discharge pattern information while the IHS in general is in the powered off state, to transmit the charge and discharge pattern information to the processor when the IHS in general is in the powered on state, to receive user control information from the processor, and to control charge and discharge of a battery according to the user control information when the IHS in general is in the powered off state.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
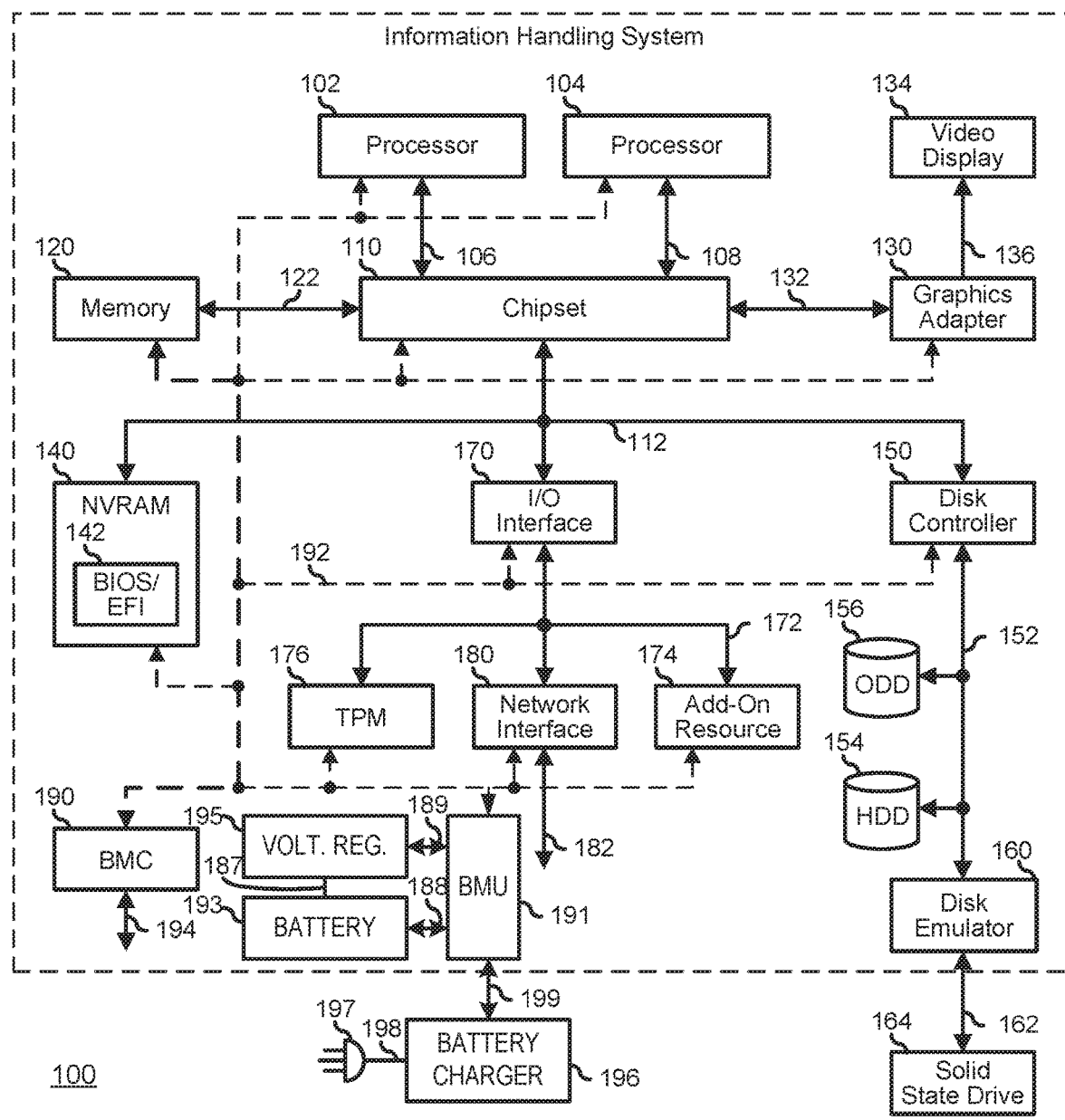
FIG. 1 is a block diagram illustrating an information handling system according, to an embodiment of the present disclosure.

FIG. 1 illustrates a generalized embodiment of information handling system 100. For purpose of this disclosure information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 100 can include processing resources for executing machine-executable code, such as a central processing unit (CPU), a programmable logic array (PLA), an embedded device such as a System-on-a-Chip (SoC), or other control logic hardware. Information handling system 100 can also include one or more computer-readable medium for storing machine-executable code, such as software or data. Additional components of information handling system 100 can include one or more storage devices that can store machine-executable code, one or more communications ports for communicating with external devices, and various input and output (I/O) devices, such as a keyboard, a mouse, and a video display. Information handling system 100 can also include one or more buses operable to transmit information between the various hardware components.

Information handling system 100 can include devices or modules that embody one or more of the devices or modules described above, and operates to perform one or more of the methods described above. Information handling system 100 includes a processors 102 and 104, a chipset 110, a memory 120, a graphics adapter 130, include a basic input and output system/extensible firmware interface (BIOS/EFI) module 140, a disk controller 150, a disk emulator 160, an input/output (I/O) interface 170, and a network interface 180, a baseboard management controller (BMC) 190, a battery management unit (BMU) 191, a battery 193, and a voltage regulator 195. Processor 102 is connected to chipset 110 via processor interface 106, and processor 104 is connected to chipset 110 via processor interface 108. Memory 120 is connected to chipset 110 via a memory bus 122. Graphics adapter 130 is connected to chipset 110 via a graphics interface 132, and provides a video display output 136 to a video display 134. In a particular embodiment, information handling system 100 includes separate memories that are dedicated to each of processors 102 and 104 via separate memory interfaces. An example of memory 120 includes random access memory (RAM) such as static RAM (SRAM), dynamic RAM (DRAM), non-volatile RAM (NV-RAM), or the like, read only memory (ROM), another type of memory, or a combination thereof.

BIOS/EFI module 140, disk controller 150, and I/O interface 170 are connected to chipset 110 via an I/O channel 112. An example of I/O channel 112 includes a Peripheral Component Interconnect (PCI) interface, a PCI-Extended (PCI-X) interface, a high-speed PCI-Express (PCIe) interface, another industry standard or proprietary communication interface, or a combination thereof. Chipset 110 can also include one or more other I/O interfaces, including an Industry Standard Architecture (ISA) interface, a Small Computer Serial Interface (SCSI) interface, an Inter-Integrated Circuit (I²C) interface, a Serial Peripheral Interface (SPI), a Universal Serial Bus (USB), another interface, or a combination thereof. BIOS/EFI module 140 includes BIOS/EFI code operable to detect resources within information handling system 100, to provide drivers for the resources, initialize the resources, and access the resources. BIOS/EFI module 140 includes code that operates to detect resources within information handling system 100, to provide drivers for the resources, to initialize the resources, and to access the resources.

Disk controller 150 includes a disk interface 152 that connects the disc controller to a hard disk drive (HDD) 154, to an optical disk drive (ODD) 156, and to disk emulator 160. An example of disk interface 152 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 160 permits a solid-state drive 164 to be connected to information handling system 100 via an external interface 162. An example of external interface 162 includes a USB interface, an IEEE 1194 (Firewire) interface, a proprietary interface, or a combination thereof. Alternatively, solid-state drive 164 can be disposed within information handling system 100.

I/O interface 170 includes a peripheral interface 172 that connects the I/O interface to an add-on resource 174 and to network interface 180. Peripheral interface 172 can be the same type of interface as I/O channel 112, or can be a different type of interface. As such, I/O interface 170 extends the capacity of I/O channel 112 when peripheral interface 172 and the I/O channel are of the same type, and the I/O interface translates information from a format suitable to the I/O channel to a format suitable to the peripheral channel 172 when they are of a different type. Add-on resource 174 can include a data storage system, an additional graphics interface, a network interface card (NIC), a sound/video processing card, another add-on resource, or a combination thereof. Add-on resource 174 can be on a main circuit board, on separate circuit board or add-in card disposed within information handling system 100, a device that is external to the information handling system, or a combination thereof.

Network interface 180 represents a NIC disposed within information handling system 100, on a main circuit board of the information handling system, integrated onto another component such as chipset 110, in another suitable location, or a combination thereof. Network interface device 180 includes network channels 182 and 184 that provide interfaces to devices that are external to information handling system 100. In a particular embodiment, network channels 182 and 184 are of a different type than peripheral channel 172 and network interface 180 translates information from a format suitable to the peripheral channel to a format suitable to external devices. An example of network channels 182 and 184 includes InfiniB and channels, Fibre Channel channels, Gigabit Ethernet channels, proprietary channel architectures, or a combination thereof. Network channels 182 and 184 can be connected to external network resources (not illustrated). The network resource can include another information handling system, a data storage system, another network, a grid management system, another suitable resource, or a combination thereof.

BMC 190 is connected by a management interface 192 to a plurality of system components, such as processor 102, processor 104, memory 120, chipset 110, graphics adapter 130, I/O interface 170, disk controller 150, NVRAM module 140, TPM 176, network interface 180, add-on resource 174, and BMU 191. BMC 190 is connected to an external management interface 194 for platform management by an external IHS. BMU 191 is connected to battery 193 via battery connection 188. BMU 191 is connected to voltage regulator 195 via voltage regulator connection 189. Battery 193 is connected to voltage regulator 195 via power connection 187. A battery charger 196 can be connected to the information handling system, for example, to BMU 191, via external power connection 199. Battery charger 196 can be connected to alternating current (AC) mains or another power source via power plug 197 and power cable 198.

IHS 100 can be turned on, placing it in a powered on state, wherein the components of IHS 100 are operational. IHS can be turned off, placing it in a powered off state, wherein the majority of components of IHS 100 are not operational. The phrase "the IHS in general" refers to the majority of components of IHS 100 which are not operational when the IHS is placed in the powered off state. In the powered off state, certain specialized components of IHS 100 may remain operational. As an example, BMU 191 may continue to be powered by battery 193 and remain operational, at least to some extent, when IHS 100 in general is not operational in the powered off state.

Figure 2:
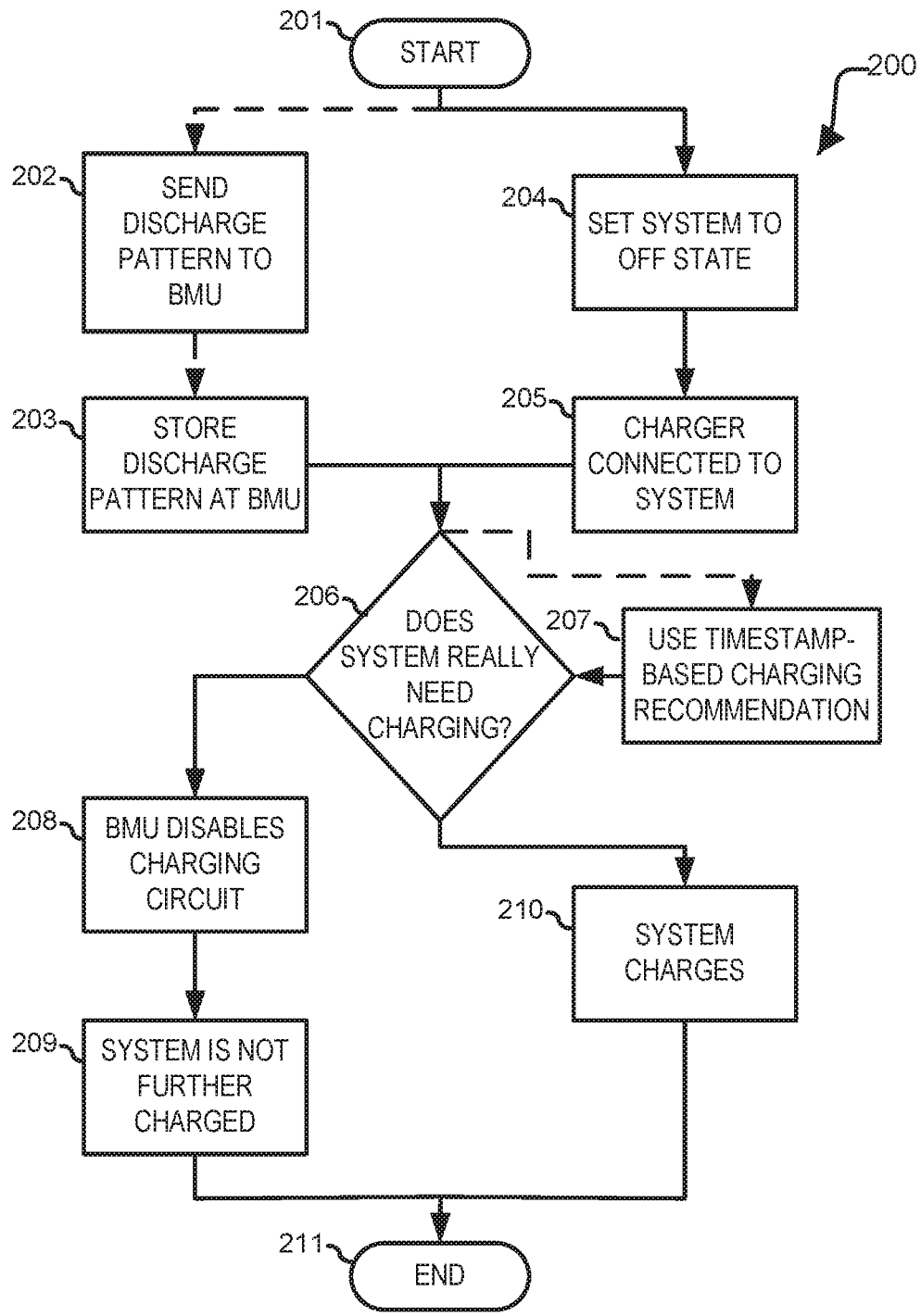
FIG. 2 is a flow diagram illustrating a method in accordance with at least one embodiment.

FIG. 2 shows a method 200 that begins at block 201 and can proceed to either of block 202 or block 204. As an example, during operation of IHS 100, method 200 can initially proceed from block 201 to block 202. For example, when IHS 100 is in an on state, method 200 may proceed to block 202. At block 202, a discharge pattern may be sent to BMU 191. As an example, the discharge pattern may be a discharge pattern obtained by system management software executed on a processor of the IHS monitoring discharge of a battery of the IHS while the IHS is in a powered on state. The information processed by the processor executing the system management software to obtain the discharge pattern may include information not accessible when the IHS is in a powered off state. As an example, the information may include information identifying particular components of the IHS that may be consuming power, which may contribute to the discharge pattern. As another example, the information may include historical information pertaining to the discharge pattern that may be stored in a storage component of the IHS that may not be operable when the IHS is in a powered off state. From block 202, method 200 proceeds to block 203. At block 203, the discharge pattern is stored at BMU 191. From block 203, method 200 proceeds to decision block 206. Operation at and following decision block 206 can proceed as will be described below.

Method 200 can proceed from block 201 to block 204. At block 204, IHS 100 is set to an off state. From block 204, method 200 can proceed to block 205. At block 205, a charger is connected to IHS 100. From block 205, method 200 can proceed to decision block 206. At decision block 206, a decision is made as to whether or not IHS 100 really needs charging. As an example, a historical-charging-data-based or timestamp-based charging recommendation can be obtained in block 207 to provide information upon which the decision of decision block 206 may be based. An example of a historical-charging-data-based technique may be found in U.S. patent application Ser. No. 16/399,634, entitled "CHARGE/DISCHARGE-PATTERN BATTERY TRAINING SYSTEM," filed Apr. 30, 2019, the entirety of which is incorporated herein by reference. An example of a timestamp-based technique may be found in U.S. patent application Ser. No. 15/974,761 entitled "SYSTEM AND METHOD FOR MANAGING A RECHARGEABLE BATTERY BASED ON HISTORICAL CHARGING DATA," filed May 9, 2018, the entirety of which is incorporated herein by reference. At decision block 206, BMU 191 can use a discharge pattern it stored at block 203 to inform its decision. At decision block 206, BMU 191 can use information it has obtained while the IHS is in a powered off state, such as information as to a charging pattern, a discharging pattern, a pattern of both charging and discharging, or the like to inform its decision. If, at decision block 206, a decision is made that IHS 100 needs charging, method 200 can proceed to block 210. At block 210, IHS 100 performs charging of battery 193. From block 210, method 200 continues to block 211, where it ends. If, at decision block 206, a decision is made that the system does not need charging, method 200 continues to block 208. At block 208, BMU 191 disables a charging circuit, preventing charging of battery 193. From block 208, method 200 continues to block 209. At block 209, IHS 100 is not further charged. From block 209, method 200 continues to block 211, where it ends. As will be shown in FIG. 3, BMU 191 can communicate, when the IHS 100 is restored to the powered on state, information BMU 191 has obtained while the IHS 100 is in the powered off state to one or more components of IHS 100 that were inoperable while IHS 100 was in the powered off state. As an example, BMU 191 can communicate a charging and discharging pattern to system management software executed on a processor of IHS 100 that is inoperable when IHS 100 is in a powered off state.

Figure 3:
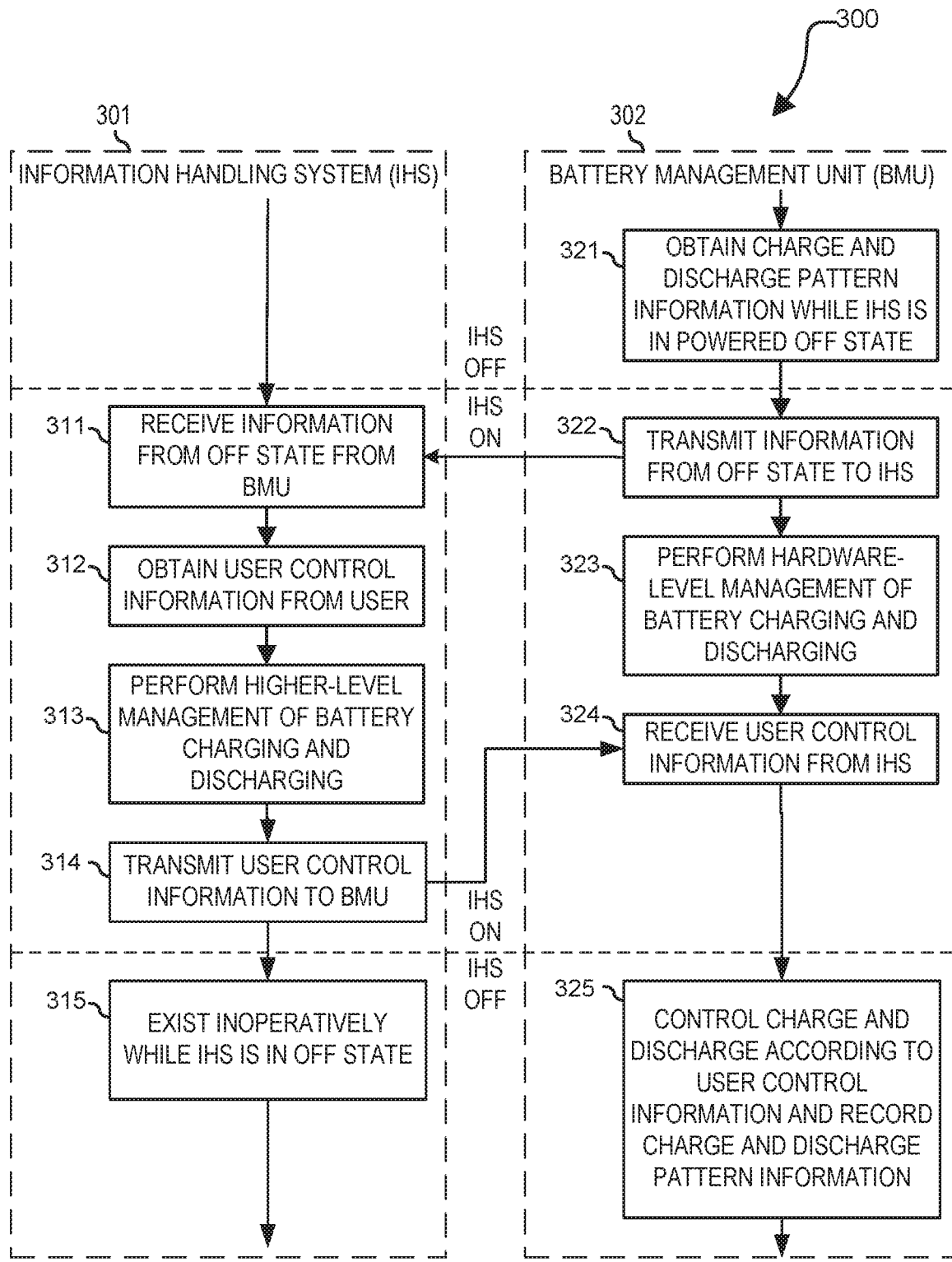
FIG. 3 is a flow diagram illustrating a method in accordance with at least one embodiment.

FIG. 3 shows a method 300 with an IHS portion 301 performed by an IHS (for example using system management software executed on a processor, such as processor 102 or 104, of the IHS) and a BMU portion 302 performed by a BMU, such as BMU 191, which can operate independently of the IHS, for example, by continuing to operate even when the IHS is in a powered off state.

Method 300 is shown as beginning at the top of FIG. 3 and proceeding downward. From the bottom of FIG. 3, method 300 can continue back to the top of FIG. 3 and repeat iteratively indefinitely. While the IHS is in a powered off state, the BMU obtains battery charge and discharge pattern information in block 321. From block 321, the IHS switches from the powered off state to the powered on state, and method 300 continues to block 322. At block 322, the BMU transmits the information it obtained to the IHS, which is now in a powered on state. At block 311, the IHS receives the information obtained by the BMU when the IHS was in the powered off state. From block 311, the IHS portion 301 of method 300 continues to block 312. At block 312, the IHS obtains user control information from a user. The user control information allows the user to exert control over the battery charge and discharge pattern of the battery of the IHS. From block 312, the IHS portion 301 of method 300 continues to block 313. At block 313, the IHS performs higher-level (such as higher than the hardware-level management provided by the BMU) management of battery charging and discharging in the IHS. Within BMU portion 302 of method 300, from block 322, method 300 continues to block 323. At block 323, the BMU performs hardware-level management of the battery charging and discharging. Within IHS portion 301 of method 300, from block 313, method 300 continues to block 314. In block 314, the IHS transmits user control information to the BMU. Within BMU portion 302 of method 300, from block 323 the BMU portion 302 of method 300 continues to block 324. At block 324, the BMU receives the user control information from the IHS. From block 324, the IHS switches from the powered on state to the powered off state, and the BMU portion 302 of method 300 continues to block 325. At block 325, the BMU controls the charging and discharging of the battery of the IHS according to user control information and records charge and discharge pattern information while the IHS is in the powered off state. Within IHS portion 301 of method 300, from block 314, method 300 continues to block 315 when the IHS switches from the powered on state to the powered off state. In the powered off state, at block 315, the components of the IHS, such as processors 102 and 104, exist inoperatively until subsequent restoration of power to the IHS, whereupon it will be placed in the powered on state.

An IHS can manage the battery charging and discharging pattern of the battery of the IHS when the IHS is in a powered on state. As an example, the charging and discharging pattern can be controlled by a user according to the user actions of the user. However, in the past, when an IHS is in a powered off state, the lack of power to circuitry that enables control over the IHS has been problematic for the management of the battery charging and discharging pattern of the battery of the IHS. Even though the IHS is in a powered off state, the IHS can charge its battery, but the powered off state has limited the ability to manage the charging and discharging pattern.

It has been found that excessive charging cycles of the battery may be undesirable. Thus, it may be desirable to prevent charging of the IHS in the powered off mode if the IHS doesn't need to be charged even though further charging could possibly occur. Therefore, a technique is provided to control the charging of the battery upon which the IHS operates, where that control is provided at levels below a fully charged stated of the battery even when the IHS is in a powered off state.

In accordance with at least one embodiment, a method and apparatus to control the learning and unlearning of a battery charge and discharge pattern are provided. Even with an IHS in a powered off state, determination can be made as to whether the battery of the IHS needs charging or not. In accordance with at least one embodiment, a user can provide scheduling information to the IHS, and the IHS can give the user a recommendation for when and how much to charge the battery of the IHS. The basis of the recommendation can include information obtained while the IHS is in a powered off state. The information obtained while the IHS is in a powered off state, for example, as may be obtained by a BMU, which can continue to operate while the IHS is in a powered down state, can be transferred, upon return of the IHS to a powered on state, to a portion of the IHS that was inoperative during the powered down state. As an example, a processor, such as processor 102 or 104, can receive the information from the BMU. In accordance with at least one embodiment, a system management application executed on the processor can provide control, such as scheduling, of charging of the battery of the IHS based at least in part, on the information obtained during the powered down state. The control can control the charging of the battery of the IHS during a powered-on time when the IHS is in a powered on state, during a powered off time when the IHS is in a powered off state, or during both the powered on time and the powered off time.

In accordance with at least one embodiment, a monitoring capability for monitoring a battery charging and discharging pattern while the IHS is in a powered off state is added in the Battery Management Unit (BMU). As system management software executed on a processor, such as processor 102 or 104, of an IHS can monitor and record a battery charge and discharge pattern while the IHS is in a powered on state, the system management software can provide such recorded information to the BMU. The BMU can obtain and record a battery charge and discharge pattern while the IHS is in a powered off state. The BMU can provide such recorded information to the system management software when the IHS is in a powered on state. So, the BMU and the system management software can be maintained in synchronization with each other as to a combined battery charge and discharge pattern spanning the powered on state and the powered off state of the IHS.

In accordance with at least one embodiment, a method can be used when an IHS is in a powered off state (such as pre-system-boot). As an example, a user may plug a charger into an IHS when the IHS is in a powered off mode. The BMU detects the connection of the charger to the IHS. The BMU reads the charge and discharge pattern of the IHS, which is already stored in BMU. The BMU continuously monitors the charge and discharge pattern when the IHS is in a powered off state. The BMU analyzes the charge and discharge pattern. After analyzing the charge and discharge pattern, the BMU makes a decision whether or not to charge the battery or to disable the charging circuit. The BMU captures and stores in the BMU a record of the charging, the discharging, and its decision to charge or not to charge. The same information can be read by the IHS from the BMU when the IHS is in a powered on state, for example, while or immediately before booting the operating system (OS). If the IHS interprets the information to indicate a problem, the IHS can take responsive action while or before booting the OS.

In accordance with at least one embodiment, a method can be used when an IHS is in a powered on state (such as post-system-boot). When an IHS is in a powered off state, a BMU monitors and controls a charging circuit as may be desired. However, once the IHS is restored to a powered on state, the BMU provides the information it obtained in the powered off state to the IHS (such as to system management software executed by a processor of the IHS), allowing the IHS to manage the charge and discharge pattern with more capability than the BMU itself and to now include awareness of the information obtained from the BMU of what happened when the IHS was in a powered off state, allowing the management provided when the IHS is in a powered on state to be based on a full awareness of the charge and discharge pattern of the battery of the IHS over all times, not only times when the IHS is in a powered on state. After obtaining the information regarding the charge and discharge pattern of the battery of the IHS during the time the IHS was in a powered off state from the BMU, the IHS can save the information and, if desired, instruct the BMU to delete the information from the storage portion of the BMU.

Given the BMU's battery connection 188 to the battery 193, the BMU is able to continue to operate (whether on battery power or otherwise) at times when other IHS components are not able to operate (such as when the IHS is in a powered off state). The BMU can even work in the event of a motherboard failure. Thus, a BMU that provides information it has obtained while other IHS components are unable to obtain such information can help system components that provides more system management capability and versatility than the BMU itself to make better and more accurate decisions once the IHS is restored to a powered on state. Therefore, management of a battery charge and discharge cycle can be provided irrespective of the system state and can incorporate awareness of battery charge and discharge pattern information spanning different power states of the IHS, including when the IHS is in a powered off state. Accordingly, not only can a voltage-based overcharge be avoided, but also the amount of charging may be limited to a calculated amount, wherein that calculated amount is less than a voltage-based overcharge limit, and the charging may be so limited even when the IHS is in a powered off state, yet information pertaining so such limiting of charging may be passed to a portion of the IHS (such as system management software executed by a processor of the IHS) that is inoperative during the powered off state, allowing that portion of the IHS to provide more capable and versatile management of battery charging and discharging while the IHS is in the powered on state than the BMU, by itself, would be capable of providing.

In accordance with at least one embodiment, a user override feature is provided. A user can establish default settings and determine whether the user wants the IHS or the BMU to make a battery charging enablement or disablement decision or not. Thus, the IHS can be responsive to user control of a battery charging decision to be made by the IHS while the IHS is in a powered on state. Even though the user interface with the IHS may be limited when the IHS is in the powered off state, as IHS components may be inoperative in the powered off state, the user can exert control over a battery charging decision and can override the settings when the IHS is in a powered off state. To override the decision that would otherwise be made by the BMU when the IHS is in a powered off state according to information passed to the BMU from the IHS when the IHS was in a powered on state, the user can plug the charging cable from the battery charger into the IHS more than once within a period of time, for example, twice within six seconds. To provide such functionality, the BMU is configured to monitor when a charger is plugged into the IHS and to determine if the charger is subsequently unplugged, then plugged in again, within the specified period of time. The BMU can be configured to ignore rapid fluctuations in its indications of the charging being plugged in and unplugged (such as in the application of power from the charger or of switch contacts signaling the plugging in and unplugging of the charger), which may result from surface imperfections on the charger plug or switch contact bouncing. Such rapid fluctuations to be ignored may be, for example, in a range of milliseconds, while actual plugging in and unplugging of the charger to be detected may be in a range of seconds (which may be extended to include tenths of seconds as well as integer seconds). If only one event of plugging in the charger within the specified period of time is detected, the BMU may operate according to its pre-existing criteria, as may be informed by information provided to it by the IHS. If more than one event of plugging in the charger within the specified period of time is detected, the BMU may allow charging to occur even if its pre-existing criteria would otherwise disable charging.

In accordance with at least one embodiment, a method comprises obtaining charge and discharge pattern information at a battery management unit (BMU) while an information handling system (IHS) is in a powered off state; transmitting the charge and discharge pattern information from the BMU to the IHS when the IHS is in a powered on state; receiving user control information from the IHS when the IHS is in the powered on state; and controlling, by the BMU, charge and discharge of the battery of the IHS according to the user control information when the IHS is in the powered off state. In accordance with at least one embodiment, the method further comprises performing, in the BMU, hardware-level management of the charge and discharge of the battery of the IHS while a component of the IHS performs higher-level management of the charge and discharge of the battery of the IHS. In accordance with at least one embodiment, the component of the IHS is a processor executing system management software. In accordance with at least one embodiment, the method further comprises obtaining, at the IHS, when the IHS is in the powered on state, the user control information from a user. In accordance with at least one embodiment, the BMU is configured to obtain BMU power for operation of the BMU from the battery when the IHS is in the powered off state. In accordance with at least one embodiment, the BMU is configured to detect a user override condition and enables charging beyond a pre-established limit. In accordance with at least one embodiment, the BMU is configured to detect the user override condition by detecting plugging in of a charger more than one time within a specified period of time.

In accordance with at least one embodiment, an information handling system (IHS) comprises a battery; a battery management unit (BMU) connected to the battery, the BMU remaining operational when the IHS in general is in a powered off state; and a processor operational when the IHS in general is in a powered on state but not when the IHS in general is in a powered off state, wherein the BMU is configured to obtain charge and discharge pattern information while the IHS in general is in the powered off state, to transmit the charge and discharge pattern information to the processor when the IHS in general is in the powered on state, to receive user control information from the processor, and to control charge and discharge of the battery according to the user control information when the IHS in general is in the powered off state. In accordance with at least one embodiment, the BMU is configured to perform, in the BMU, hardware-level management of the charge and discharge of the battery of the IHS while the processor performs higher-level management of the charge and discharge of the battery of the IHS. In accordance with at least one embodiment, the processor is configured to execute system management software, the processor executing the system management software configured to receive the charge and discharge pattern information from the BMU, to obtain the user control information from a user, and to transmit the user control information to the BMU. In accordance with at least one embodiment, the processor is configured to obtain, at the processor, when the IHS is in the powered on state, the user control information from a user. In accordance with at least one embodiment, the BMU is configured to obtain BMU power for operation of the BMU from the battery when the IHS is in the powered off state. In accordance with at least one embodiment, the BMU is configured to detect a user override condition and to enable charging beyond a pre-established limit. In accordance with at least one embodiment, the BMU is configured to detect the user override condition by detecting plugging in of a charger more than one time within a specified period of time.

In accordance with at least one embodiment, a method comprises sending, at an information handling system (IHS), a charge and discharge pattern to a battery management unit (BMU); storing, at the BMU, the charge and discharge pattern; setting the IHS to a powered off state; detecting, at the BMU, when the IHS is in the powered off state, connection of a charger to the IHS; determining, at the BMU, when the IHS is in the powered off state, based on the charge and discharge pattern, whether a battery of the IHS needs charging; when the battery needs charging, charging the battery; and, when the battery does not need charging, disabling a charging circuit. In accordance with at least one embodiment, a processor of the IHS is configured to execute system management software to performs higher-level management of the charge and discharge of the battery of the IHS when the IHS is in a powered on state, and the BMU is configured to provide hardware-level management of the charge and discharge of the battery of the IHS both when the IHS is in the powered on state and when the IHS is in the powered off state. In accordance with at least one embodiment, the method further comprises obtaining, at the IHS, when the IHS is in the powered on state, user control information from a user, wherein the BMU is configured to control charge and discharge of the battery of the IHS according to the user control information when the IHS is in the powered off state. In accordance with at least one embodiment, the BMU is configured to obtain BMU power for operation of the BMU from the battery when the IHS is in the powered off state. In accordance with at least one embodiment, the BMU is configured to detect a user override condition and enables charging beyond a pre-established limit. In accordance with at least one embodiment, the BMU is configured to detect the user override condition by detecting plugging in of a charger more than one time within a specified period of time.

As used herein, the phrase "charge and discharge pattern" refers to a pattern of battery activity comprising any of charging, discharging, or a combination of charging and discharging, and the phrase "combined charge and discharge pattern" refers to a pattern of battery activity comprising both charging and discharging. Embodiments described with reference to a "charge and discharge pattern" can alternatively be implemented as embodiments practiced with reference to a "combined charge and discharge pattern."

For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, the information handling system can be a personal computer, a laptop computer, a smart phone, a tablet device or other consumer electronic device, a network server, a network storage device, a switch router or other network communication device, or any other suitable device and may vary in size, shape, performance, functionality, and price. Further, the information handling system can include processing resources for executing machine-executable code, such as a central processing unit (CPU), a programmable logic array (PLA), an embedded device such as a System-on-a-Chip (SoC), or other control logic hardware. An information handling system can also include one or more computer-readable medium for storing machine-executable code, such as software or data. Additional components of an information handling system can include one or more storage devices that can store machine-executable code, one or more communications ports for communicating with external devices, and various input and output (I/O) devices, such as a keyboard, a mouse, and a video display. Information handling systems can also include one or more buses operable to transmit information between the various hardware components.

When referred to as a "device," a "module," a "unit," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

The present disclosure contemplates a computer-readable medium that includes instructions or receives and executes instructions responsive to a propagated signal; so that a device connected to a network can communicate voice, video or data over the network. Further, the instructions may be transmitted or received over the network via the network interface device.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A method comprising:
   obtaining charge and discharge pattern information of a battery of an information handling system (IHS) at a battery management unit (BMU) while an IHS in general is in a powered off state such that a processor of the IHS configured to execute system management software is inoperable when the IHS in general is in the powered off state;
   transmitting the charge and discharge pattern information from the BMU to the IHS when the IHS in general is in a powered on state;
   receiving user control information from the IHS when the IHS in general is in the powered on state; and
   controlling, by the BMU, charge and discharge of the battery of the IHS according to the user control information when the IHS in general is in the powered off state, wherein the BMU is configured to detect a user override condition by detecting plugging in of a charger more than one time within a specified period of time and to enable charging beyond a pre-established limit.

2. The method of claim 1 further comprising:
   performing, in the BMU, hardware-level management of the charge and discharge of the battery of the IHS while a component of the IHS performs higher-level management of the charge and discharge of the battery of the IHS.

3. The method of claim 2, wherein the component of the IHS is the processor.

4. The method of claim 1 further comprising:
   obtaining, at the IHS, when the IHS in general is in the powered on state, the user control information from a user.

5. The method of claim 1, wherein the BMU is configured to obtain BMU power for operation of the BMU from the battery when the IHS in general is in the powered off state.

6. An information handling system (IHS) comprising:
   a battery;
   a battery management unit (BMU) connected to the battery, the BMU remaining operational when the IHS in general is in a powered off state; and
   a processor configured to execute system management software operational when the IHS in general is in a powered on state but inoperable when the IHS in general is in a powered off state, wherein the BMU is configured to obtain charge and discharge pattern information while the IHS in general is in the powered off state, to transmit the charge and discharge pattern information to the processor when the IHS in general is in the powered on state, to receive user control information from the processor, and to control charge and discharge of the battery according to the user control information when the IHS in general is in the powered off state, wherein the BMU is configured to detect a user override condition by detecting plugging in of a charger more than one time within a specified period of time and to enable charging beyond a pre-established limit.

7. The information handling system of claim 6, wherein the BMU is configured to perform, in the BMU, hardware-level management of the charge and discharge of the battery of the IHS while the processor performs higher-level management of the charge and discharge of the battery of the IHS.

8. The information handling system of claim 7, wherein the processor is configured to execute system management software, the processor executing the system management software configured to receive the charge and discharge pattern information from the BMU, to obtain the user control information from a user, and to transmit the user control information to the BMU.

9. The information handling system of claim 6, wherein the processor is configured to obtain, at the processor, when the IHS in general is in the powered on state, the user control information from a user.

10. The information handling system of claim 6, wherein the BMU is configured to obtain BMU power for operation of the BMU from the battery when the IHS in general is in the powered off state.

11. A method comprising:
sending, at an information handling system (IHS), a charge and discharge pattern to a battery management unit (BMU);
storing, at the BMU, the charge and discharge pattern;
setting the IHS in general to a powered off state, such that a processor of the IHS configured to execute system management software is inoperable when the IHS in general is in the powered off state;
detecting, at the BMU and when the IHS in general is in the powered off state, connection of a charger to the IHS;
determining, at the BMU and when the IHS in general is in the powered off state, based on the charge and discharge pattern, whether a battery of the IHS needs charging;
when the battery needs charging, charging the battery; and
when the battery does not need charging, disabling a charging circuit, wherein the BMU is configured to detect a user override condition by detecting plugging in of a charger more than one time within a specified period of time and to enable charging beyond a pre-established limit.

12. The method of claim 11, wherein the processor of the IHS is configured to perform higher-level management of the charge and discharge of the battery of the IHS when the IHS in general is in a powered on state, and the BMU is configured to provide hardware-level management of the charge and discharge of the battery of the IHS both when the IHS in general is in the powered on state and when the IHS in general is in the powered off state.

13. The method of claim 11 further comprising:
obtaining, at the IHS, when the IHS in general is in the powered on state, user control information from a user, wherein the BMU is configured to control charge and discharge of the battery of the IHS according to the user control information when the IHS in general is in the powered off state.

14. The method of claim 11, wherein the BMU is configured to obtain BMU power for operation of the BMU from the battery when the IHS in general is in the powered off state.

* * * * *